United States Patent
Andry et al.

(10) Patent No.: US 8,173,541 B2
(45) Date of Patent: May 8, 2012

(54) CHIP CARRIER SUBSTRATE INCLUDING CAPACITOR AND METHOD FOR FABRICATION THEREOF

(75) Inventors: Paul S. Andry, Yorktown Heights, NY (US); Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 12/542,269

(22) Filed: Aug. 17, 2009

(65) Prior Publication Data
US 2009/0301992 A1 Dec. 10, 2009

Related U.S. Application Data

(62) Division of application No. 11/624,436, filed on Jan. 18, 2007, now Pat. No. 7,719,079.

(51) Int. Cl.
*H01L 21/4763* (2006.01)

(52) U.S. Cl. ........ 438/638; 438/637; 438/639; 257/774; 257/E23.067; 257/E21.577

(58) Field of Classification Search .................. 438/254, 438/256, 238; 257/300, 310, 296
See application file for complete search history.

(56) References Cited

U.S. PATENT DOCUMENTS

| 7,030,481 | B2 | 4/2006 | Chudzik et al. | |
|---|---|---|---|---|
| 2005/0026356 | A1 * | 2/2005 | Kim | 438/238 |
| 2005/0275005 | A1 * | 12/2005 | Choi et al. | 257/300 |
| 2007/0032015 | A1 * | 2/2007 | Itoh et al. | 438/250 |

* cited by examiner

*Primary Examiner* — Fernando L Toledo
*Assistant Examiner* — Mark A Laurenzi
(74) *Attorney, Agent, or Firm* — Scully, Scott, Murphy & Presser, P.C.; Vazken Alexanian

(57) ABSTRACT

A chip carrier substrate includes a capacitor aperture and a laterally separated via aperture, each located within a substrate. The capacitor aperture is formed with a narrower linewidth and shallower depth than the via aperture incident to a microloading effect within a plasma etch method that is used for simultaneously etching the capacitor aperture and the via aperture within the substrate. Subsequently a capacitor is formed and located within the capacitor aperture and a via is formed and located within the via apertures. Various combinations of a first capacitor plate layer, a capacitor dielectric layer and a second capacitor plate layer may be contiguous with respect to the capacitor aperture and the via aperture.

18 Claims, 3 Drawing Sheets

CHIP CARRIER SUBSTRATE INCLUDING CAPACITOR AND METHOD FOR FABRICATION THEREOF

RELATED APPLICATIONS

This application is a divisional of U.S. application Ser. No. 11/624,436, filed Jan. 18, 2007.

BACKGROUND

1. Field of the Invention

The invention relates generally to chip carrier substrates used within semiconductor fabrication. More particularly, the invention relates to chip carrier substrates fabricated with enhanced efficiency.

2. Description of the Related Art

In order to provide enhanced levels of connectivity, as well as increased power distribution and signal processing options, semiconductor chips are often mated and affixed to chip carrier substrates. Chip carrier substrates typically include additional conductor layers and separating dielectric layers beyond those included within a semiconductor chip. Thus, chip carrier substrates provide enhanced levels of connectivity of a semiconductor chip to a further assembled higher level electrical component.

While chip carrier substrates are thus essential in providing enhanced performance to microelectronic circuits, chip carrier substrates are nonetheless not entirely without problems. In particular, additional advancements and enhancements in chip carrier substrate performance are generally desirable.

Various chip carrier substrates, and methods for fabrication thereof, are known in the semiconductor fabrication art. In particular, Chudzik et al., in U.S. Pub. No. 2004/0108587, teaches a chip carrier substrate with enhanced capabilities. This particular chip carrier substrate includes a passive decoupling device, such as a decoupling capacitor or a decoupling resistor, in addition to the conventional conductor interconnect layers that are separated by dielectric layers within the chip carrier substrate.

Chip carrier substrates are likely to be of considerable continued interest in microelectronic fabrication since continued enhancements in performance and functionality of microelectronic circuits is desirable. Thus, also desirable are chip carrier substrates with enhanced performance, and methods for fabrication thereof.

SUMMARY

The invention provides a chip carrier substrate and methods for fabricating the chip carrier substrate. The methods for fabricating the chip carrier substrate take advantage of a microloading effect when plasma etching within the chip carrier substrate: (1) a first aperture into which is located a capacitor; and (2) a second aperture into which is located a via. The microloading effect within the plasma etch method provides the first aperture with both a narrower linewidth and a more limited depth than the second aperture. A chip carrier substrate in accordance with the invention derives from the method for fabricating the chip carrier substrate in accordance with the invention.

A chip carrier substrate in accordance with the invention includes a substrate including a capacitor aperture located within the substrate laterally separated from a via aperture located through the substrate. The chip carrier substrate also includes a capacitor located within the capacitor aperture and a via located within the via aperture, where the capacitor aperture has narrower linewidth than the via aperture.

A method for fabricating a chip carrier substrate in accordance with the invention includes forming simultaneously a capacitor aperture laterally separated from a via aperture within a substrate. The method also includes forming a capacitor within the capacitor aperture and a via within the via aperture.

Another method for fabricating a chip carrier substrate in accordance with the invention includes forming simultaneously a capacitor aperture laterally separated from a via aperture within a substrate. In particular, the capacitor aperture is formed simultaneously of narrower linewidth and shallower depth than the via aperture. This other method also includes forming a capacitor within the capacitor aperture and a via within the via aperture.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION

The invention, which includes a chip carrier substrate and methods for fabricating the chip carrier substrate, is understood within the context of the description provided below. The description provided below is understood within the context of the drawings described above. Since the drawings are intended for illustrative purposes, the drawings are not necessarily drawn to scale.

Figure 1:
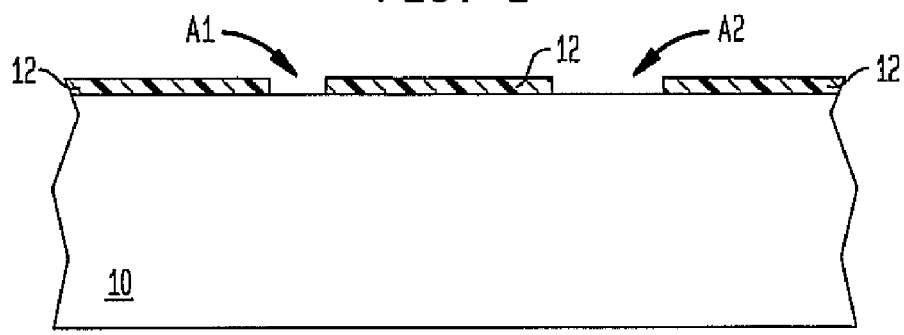
FIG. 1 to FIG. 12 show a series of schematic cross-sectional diagrams illustrating the results of progressive stages in fabricating a chip carrier substrate in accordance with particular embodiments of the invention.

FIG. 1 to FIG. 12 show a series of schematic cross-sectional diagrams illustrating the results of progressive stages in fabricating a chip carrier substrate in accordance with particular embodiments of the invention. FIG. 1 shows a schematic cross-sectional diagram of the chip carrier substrate at an early stage in fabrication thereof in accordance with the embodiments.

FIG. 1 shows a substrate 10 and a mask layer 12 located upon the substrate 10.

The substrate 10 may comprise any of several microelectronic materials. Non-limiting examples of suitable microelectronic materials include microelectronic conductor materials, microelectronic semiconductor materials and microelectronic dielectric materials. For ease in further processing within the context of further disclosure below, the substrate 10 typically comprises a semiconductor material, and in particular the substrate 10 typically comprises a semiconductor substrate. Semiconductor substrates are know in the semiconductor fabrication art to comprise semiconductor materials including but not limited to silicon, germanium, silicon-germanium alloy, silicon carbide, silicon-germanium carbide alloy semiconductor materials. Also known in the art are compound semiconductor materials which may include, but are not limited to gallium arsenide, indium arsenide and indium phosphide semiconductor materials. Typically, the substrate 10 comprises a silicon semiconductor material that has a thickness from about 650 to about 800 microns.

The mask layer 12 (i.e., illustrated within the context of individual mask layer patterns each of which is designated as a mask layer 12) may comprise any of several mask layer materials. General non-limiting examples of mask layer materials include photoresist mask materials and hard mask materials. However, within the context of the instant embodiments, hard mask materials are considerably more common. Hard mask materials typically but not exclusively include oxides, nitrides and oxynitrides of silicon. Oxides, nitrides and oxynitrides of other elements are not excluded, although they are considerably less common. Typically the mask layer 12 comprises a silicon nitride hard mask material that has a thickness from about 500 to about 1000 angstroms.

As is further illustrated in FIG. 1, the mask layer 12 defines a first aperture A1 and a second aperture A2. The substrate 10 is exposed at the bottom of each of the first aperture A1 and the second aperture A2. Typically, the first aperture A1 has a linewidth from about 0.2 to about 1.0 microns and the second aperture A2 has a linewidth from about 2.0 to about 4.0 microns. Thus, within the context of the instant embodiment the second aperture A2 is always wider than the first aperture A1.

Figure 2:
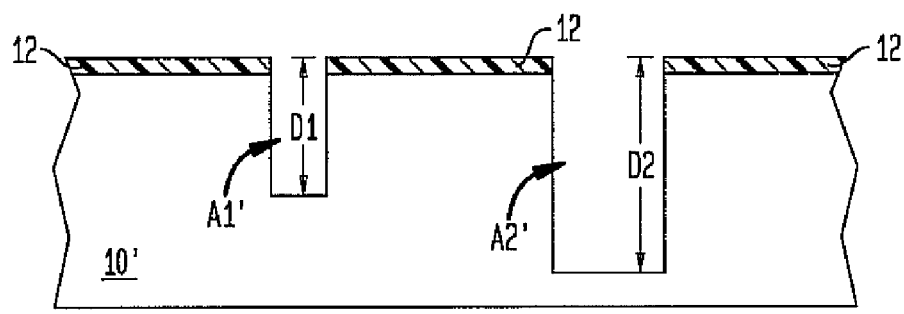

FIG. 2 shows the results of etching the substrate 10 at the locations of the first aperture A1 and the second aperture A2. As a result of the foregoing etching, a first aperture A1' is formed within a substrate 10' from the first aperture A1 and a second aperture A2' is formed within the substrate 10' from the second aperture A2.

The instant embodiment contemplates that a reactive ion etch method (i.e., a plasma etch method) is used to form the first aperture A1' from the first aperture A1 and the second aperture A2' from the second aperture A2. The instant embodiment also contemplates that the reactive ion etch method also exhibits a microloading effect. The microloading effect provides that the first aperture A1' is etched to a first depth D1 less than a second depth D2 of the second aperture A2', since the linewidth of the first aperture A1 is less than the linewidth of the second aperture A2. Typically the first aperture A1' has a first depth D1 from about 5 to about 50 microns and the second aperture has a second depth D2 from about 100 to about 200 microns.

More specifically with respect to the plasma etch method that is used for etching the first aperture A1 to form the first aperture A1' and the second aperture A2 to form the second aperture A2', such a plasma etch method may be otherwise generally conventional in the semiconductor fabrication art. When the substrate 10' comprises a silicon semiconductor substrate, the plasma etch method may use an etchant gas composition that is also generally conventional in the semiconductor fabrication art. Suitable etchant gas compositions for etching silicon semiconductor substrates include chlorine containing etchant gas compositions and fluorine containing etchant gas compositions. Chlorine containing etchant gas compositions may include, but are not limited to chlorine and hydrogen chloride. Fluorine containing etchant gas compositions may include, but are not limited hydrogen fluoride, nitrogen trifluoride and sulfur hexafluoride. Suitable non-reactive diluents gases and sputtering gases may also be included. Non-limiting examples of such gases include helium, argon, neon and krypton gases.

The plasma etch process for forming the first aperture A1' and the second aperture A2' may also include a two step etch process. Such a two step etch process may use the etch step as described above, followed by a sidewall passivation or hydrocarbon deposition step which coats the sidewalls of an etched feature (i.e., such as the first aperture A1' and the second aperture A2') to keep the sidewalls of the etched feature vertical throughout the two step etch process. Particular gases which may lead to sidewall hydrocarbon deposition are trifluoromethane (i.e., CFH3) and carbon tetrafluoride (i.e., CH4). Others are not excluded. Individual etch process steps and sidewall deposition process steps may cycle many times during the two step process.

Typically, the foregoing plasma etch method also uses: (1) a reactor chamber pressure from about 100 to about 1000 mtorr; (2) a substrate 10 temperature from about +20 to about −10 degrees centigrade; (3) a source radio frequency power from about 500 to about 1000 watts; (4) a bias power from about 50 to about 150 watts; and (5) an etchant gas flow rate from about 10 to about 100 standard cubic centimeters per minute (sccm).

Although not specifically illustrated within the schematic cross-sectional diagram of FIG. 2, each of the first aperture A1' and the second aperture A2' may provide for an undercut of the substrate 10' beneath the mask layer 12. Such an undercut maybe from about 0.1 to about 1.0 microns.

Figure 3:
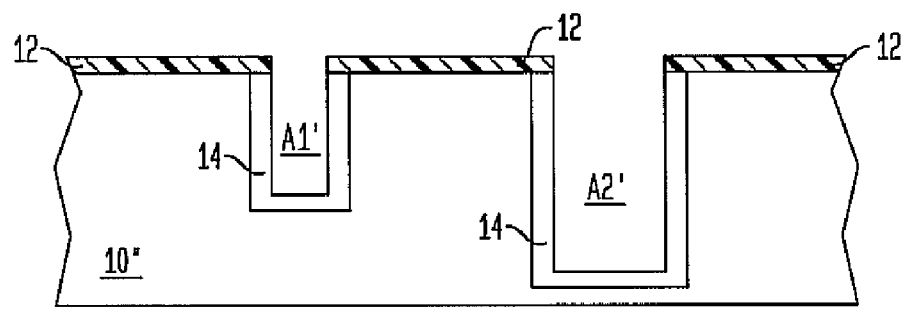

FIG. 3 shows the results of optionally thermally oxidizing the substrate 10' that is illustrated in FIG. 2 to form dielectric liner layers 14 within the first aperture A1' and the second aperture A2' within a substrate 10". Such a thermal oxidation is optional within alternative embodiments of the invention under circumstances where the substrate 10" comprises a dielectric material. However, within the instant embodiment where the substrate 10" preferably comprises a semiconductor material, a thermal oxidation (or alternative dielectric isolation) is required for the first aperture A1' and the second aperture A2' with respect to the substrate 10".

Such a thermal oxidation typically uses an oxygen containing environment, often at ambient conditions of pressure. Typically, the thermal oxidation is undertaken at a temperature from about 900 to about 1100 degrees centigrade for a time period from about 1 to about 10 hours. The resulting dielectric liner layers 14 have a thickness from about 0.1 to about 2.0 microns. As an alternative to the foregoing thermal oxidation, the embodiment also contemplates the use of a conformal dielectric liner layer fully covering the chip carrier substrate whose schematic cross-sectional diagram is illustrated in FIG. 2. Such a conformal dielectric liner layer may comprise a dielectric material such as but not limited to an oxide, nitride or oxynitride of silicon. Such a conformal dielectric liner layer may also be formed to a thickness from about 500 to about 1000 angstroms.

Figure 4:
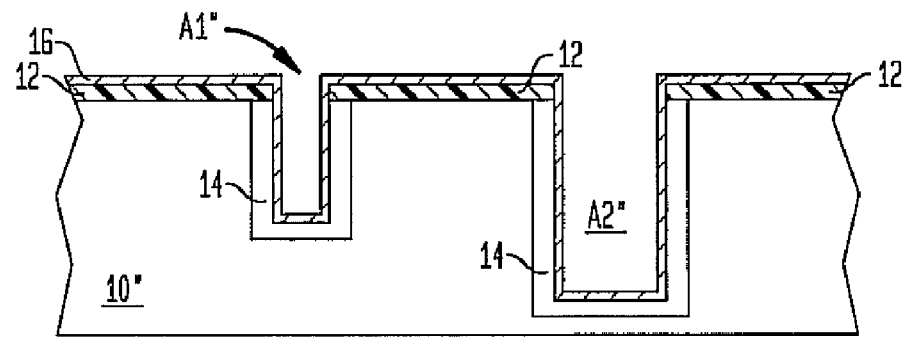

FIG. 4 shows a first capacitor plate layer 16 located conformally covering the chip carrier substrate of FIG. 3, thus forming apertures A1" and A2" from apertures A1' and A2'. The first capacitor plate layer 16 may comprise any of several capacitor plate materials. Non-limiting examples of capacitor plate materials include tantalum, tungsten and titanium capacitor plate materials. Also included as non-limiting examples are nitrides of tantalum, tungsten and titanium. Further included as non-limiting examples of capacitor plate materials are silicides of tantalum, tungsten and titanium. Other capacitor plate materials are not excluded. The first capacitor plate layer 16 may be formed using any of several methods. Non-limiting examples include chemical vapor deposition methods (including atomic layer chemical vapor deposition methods) and physical vapor deposition methods (including sputtering methods). Typically, the first capacitor plate layer 16 comprises a tantalum capacitor plate material that has a thickness from about 500 to about 2500 angstroms.

Figure 5:
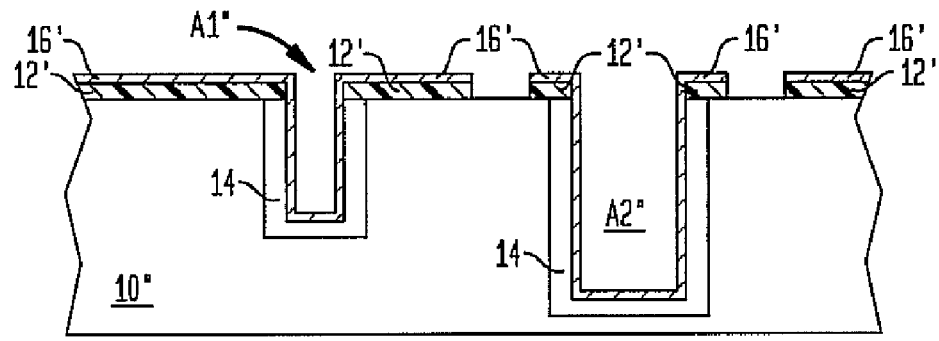

FIG. 5 shows the results of etching and patterning the first capacitor plate layer 16 and underlying portions of specific mask layer patterns within the mask layer 12 to form a corresponding first capacitor plate layer 16' and a corresponding mask layer 12'. The foregoing etching and patterning is intended to interrupt continuity of the first capacitor plate layer 16 that is illustrated in FIG. 4 when forming the first capacitor plate layer 16' that is illustrated in FIG. 5. The foregoing etching and patterning is also intended to expose portions of the substrate 10" that preferably comprises a semiconductor material.

The foregoing etching and patterning may also be effected using methods and materials that are conventional in the semiconductor fabrication art. Non-limiting examples include wet chemical etch methods, dry plasma etch methods and aggregate etch methods thereof. Plasma etch methods are particularly common. Plasma etch methods will typically use etchant gas compositions that are appropriate for the individual materials from which are comprised the first capacitor plate layer 16 and the mask layer 12.

Figure 6:
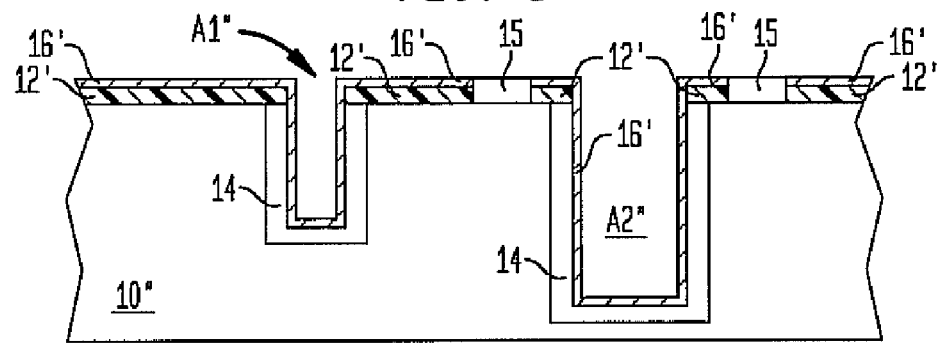

FIG. 6 shows a plurality of isolation regions 15 located filling the gaps left by severed portions of the first capacitor plate layer 16' and the mask layer 12' that are illustrated in FIG. 5. Under circumstances within the preferred embodiments where the substrate 10" comprises a semiconductor substrate, and in particular a silicon semiconductor substrate, the isolation regions 15 may be formed incident to a blanket layer deposition and planarization method when the first aperture A1" and the second aperture A2" are otherwise filled with a sacrificial filler material. As is understood by a person skilled in the art, FIG. 5 and FIG. 6 illustrate an optional processing of the chip carrier substrate that is illustrated in FIG. 4. his optional processing is intended to provide for severance of the first capacitor plate layer 16 when forming the first capacitor plate layer 16'.

Beyond the embodiment disclosed within the context of FIG. 5 and FIG. 6, additional embodiments are also contemplated for severance of the first capacitor plate layer 16. A non-limiting example of such embodiments includes severance of only the first capacitor plate layer 16 absent any etching of the hard mask layer 12. Another non-limiting example of such embodiments includes provides for forming the isolation region 15 prior to deposition of the first capacitor plate layer 16. Since the isolation region 15 has a greater thickness than the mask layer 12, when the first capacitor plate layer 16 is deposited upon the mask layer 12' and the isolation regions 15, the first capacitor plate layer 16 may be planarized in a self-aligned fashion to form the first capacitor plate layer 16'.

Figure 7:
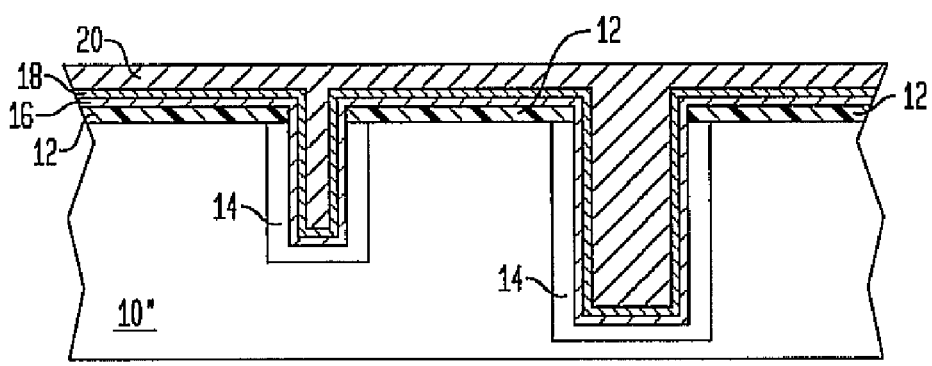

FIG. 7 illustrates the results of alternative further processing of the chip carrier substrate that is illustrated in FIG. 4, absent the intervening optional processing steps that are illustrated within the context of the chip carrier substrates that are illustrated in FIG. 5 and FIG. 6.

FIG. 7 illustrates a capacitor dielectric layer 18 located upon the chip carrier substrate of FIG. 4. FIG. 7 also illustrates a second capacitor plate layer 20 located upon the capacitor dielectric layer 18.

The capacitor dielectric layer 18 may comprise any of several appropriate capacitor dielectric materials. Generally conventional capacitor dielectric materials include oxides, nitrides and oxynitrides of silicon that have a dielectric constant from about 4 to about 20, measured in vacuum. Oxides, nitrides and oxynitrides of other elements are not excluded. The embodiments also contemplate that capacitor dielectric materials having a generally higher dielectric constant of up to at least about 100 may also be used. Examples of such generally higher dielectric constant dielectric materials include barium-strontium-titanates (BSTs) and lead-zirconate-titanates (PZTs). Any of the foregoing types of capacitor dielectric materials may be formed using methods that are generally conventional in the semiconductor fabrication art, and are otherwise also appropriate to the materials of composition of the capacitor dielectric layer 18. Non-limiting examples of methods include chemical vapor deposition methods (including atomic layer chemical vapor deposition methods) and physical vapor deposition methods (including sputtering methods).

A desirable example of a capacitor dielectric material from which may be comprised the capacitor dielectric layer 18 may be in particular an oxide of a first capacitor plate material from which is comprised the first capacitor plate layer 16. Under such circumstances, this particular embodiment contemplates that the first capacitor plate layer 16 maybe electrochemically or thermally oxidized to form the capacitor dielectric material. For example, and without limitation, a first capacitor plate layer comprised of tantalum may be anodically electrochemically oxidized to form a capacitor dielectric layer comprising a tantalum oxide. Typically, the capacitor dielectric layer 18 has a thickness from about 50 to about 500 angstroms.

The second capacitor plate layer 20 comprises a second capacitor plate material. The second capacitor plate material may comprise a capacitor plate material that may be either the same as or different than the first capacitor plate material. Typically, the second capacitor plate layer 20 also comprises a second capacitor plate material that comprises a metal, metal nitride or metal silicide material. Typically, the second capacitor plate layer has a thickness from about 0.5 to about 2.0 microns to completely fill the first aperture A1" and the second aperture A2". The second capacitor plate material may be formed using methods including but not limited to chemical vapor deposition methods and physical vapor deposition methods. Preferably, the second capacitor plate material comprises a chemical vapor deposited (CVD) tungsten material formed to a thickness from about 0.5 to about 2.0 microns to completely cover the chip carrier substrate that is illustrated in FIG. 4 when forming the chip carrier substrate that is illustrated in FIG. 7.

Figure 8:
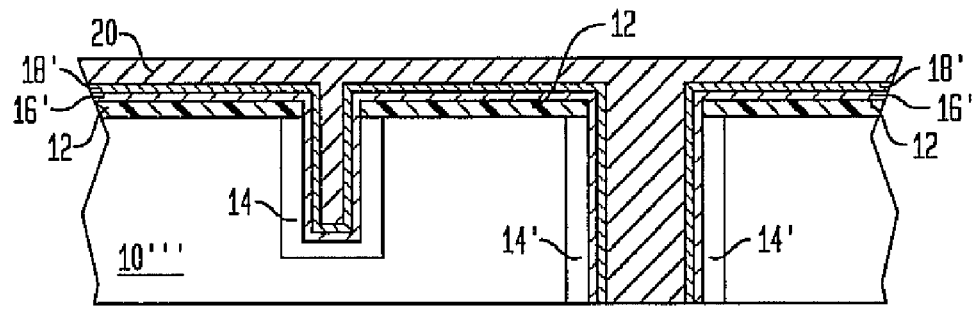

FIG. 8 shows the results of thinning the substrate 10" that is illustrated in FIG. 7 to form a substrate 10'''. FIG. 8 also shows the results of removing bottom portions of the dielectric liner layer 14, the first capacitor plate layer 16 and the capacitor dielectric layer 18 at the location of the second aperture A2" that is illustrated in FIG. 4 to form a dielectric liner layer 14', a first capacitor plate layer 16' and a capacitor dielectric layer 18'. The foregoing thinning is also intended to provide that the second capacitor plate layer 20 is fully exposed at the bottom portion of the chip carrier substrate that is illustrated in FIG. 8.

The foregoing thinning may be effected using methods that are conventional in the semiconductor fabrication art. Particular thinning methods include chemical etch thinning methods, as well as planarizing thinning methods. Planarizing thinning methods include mechanical planarizing methods, as well as chemical mechanical polish (CMP) planarizing methods. Chemical mechanical polish planarizing methods are particularly common.

Figure 9:
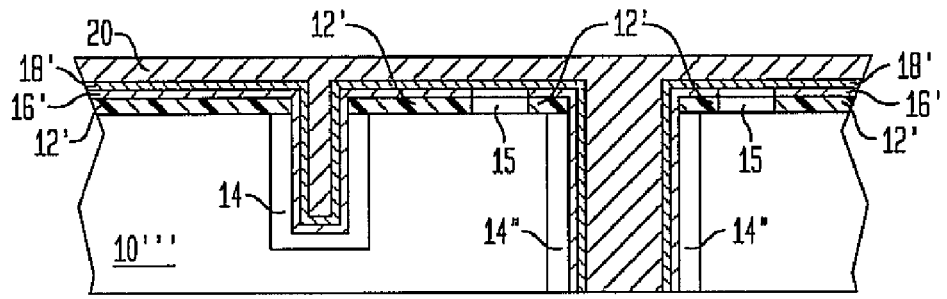
Figure 10:
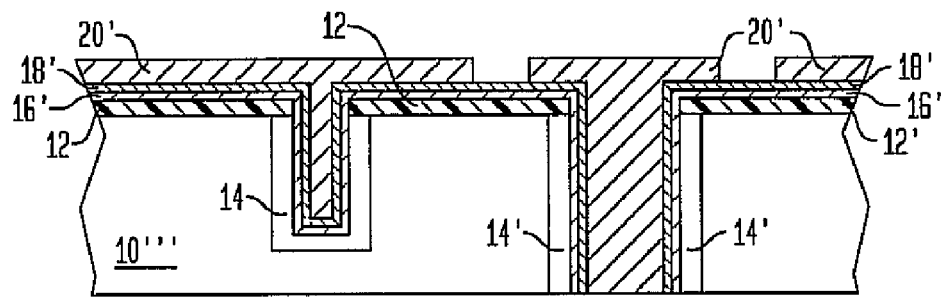
Figure 11:
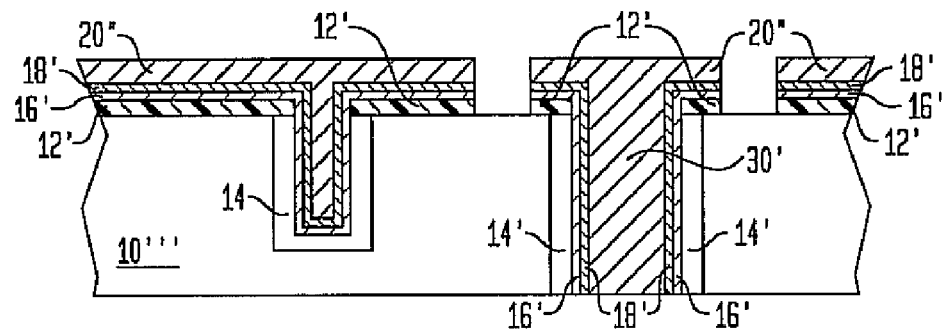

FIG. 9, FIG. 10 and FIG. 11 show three additional embodiments of the invention, beyond the embodiment that is illustrated in FIG. 8. These three additional embodiments of the invention are intended to correspond with the embodiment that is illustrated in FIG. 8, but show certain variations with respect to severing of the first capacitor plate layer 16 to provide the first capacitor plate layer 16' (FIG. 9), severing the second capacitor plate layer 20 to form the second capacitor plate layer 20' (FIG. 10) or severing both the first capacitor plate layer 16 and the second capacitor plate layer 20 to form the first capacitor plate layer 16' and the second capacitor plate layer 20' (FIG. 11). The selective severing provides structures that allow for different levels of contiguousness of the first capacitor plate layer 16, the capacitor dielectric layer 18 and the second capacitor plate layer 20 with respect to the first aperture A1 and the second aperture A2 that are illustrated in FIG. 2.

The chip carrier substrate whose schematic cross-sectional diagram is illustrated in FIG. 9 results from further processing of the chip carrier substrate whose schematic cross-sectional diagram is illustrated in FIG. 6, within the context of further processing that is illustrated in FIG. 7 and FIG. 8. The chip carrier substrate that is illustrated in FIG. 10 results from further processing of the chip carrier substrate that is illustrated in FIG. 8 by patterning of the second capacitor plate layer 20 only. The chip carrier substrate that is illustrated in FIG. 11 results from further processing of the chip carrier substrate that is illustrated in FIG. 8 by patterning of the second capacitor plate layer 20, the capacitor dielectric layer 18 and the first capacitor plate layer 16. The foregoing patterning within the context of the chip carrier substrates of FIG. 10 and FIG. 11 may be undertaken using methods and materials that are otherwise generally conventional in the semiconductor fabrication art. Included in particular are plasma etch methods, although the embodiments are not necessarily so limited.

Figure 12:
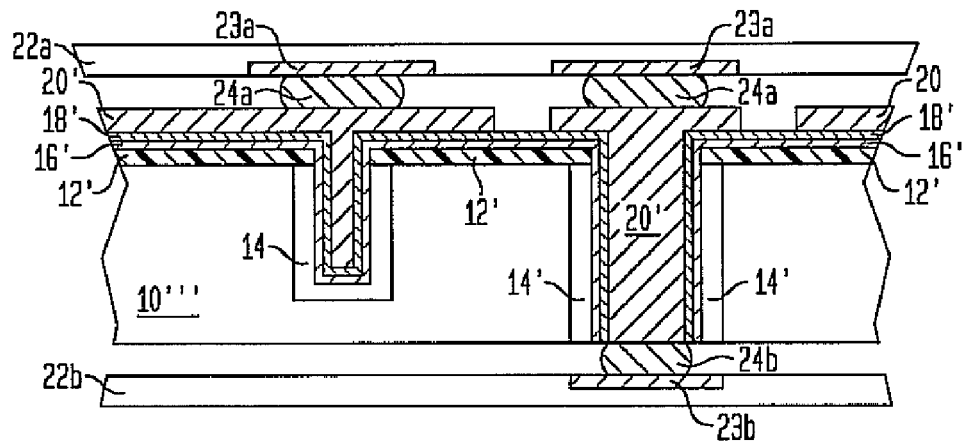

FIG. 12 shows a schematic cross-sectional diagram illustrating the results of further processing and assembly of the chip carrier substrate of FIG. 10, although the same further processing and assembly is also applicable to the chip carrier substrates of FIG. 8, FIG. 9 and FIG. 11. FIG. 12 shows a first substrate 22a having a plurality of first contact regions 23a and 23b located therein and connected to separated portions of the second capacitor plate layer 20' through a plurality of first solder layers 24a. Also shown in FIG. 12 is second substrate 22b having a second contact region 23b located therein and connected to a second portion of the second capacitor plate layer 20' at the location of the via within the second aperture A2.

Within the instant embodiment, the first substrate 22a typically comprises a semiconductor substrate and the first contact regions 23a typically comprise conductor contact layers within the semiconductor substrate. The semiconductor substrate from which is comprised the first substrate 22a is intended to include semiconductor devices, as well as interconnection circuitry for purposes of accessing the semiconductor devices. The first contact regions 23a comprise conductor contact materials. Suitable conductor contact materials include metals, metal alloys, metal nitrides and metal silicides. Also included, and also not limiting, are doped polysilicon and polycide conductor contact materials. The plurality of first solder layers 24a may comprise any of several solder materials. Non-limiting examples of solder materials include lead, tin and antimony alloy solder materials.

The second substrate 22b is often intended, but not necessarily limited to, a multi-layer ceramic substrate. Such a multi-layer ceramic substrate includes multiple conductor layers that are separated by multiple dielectric layers. Multi-layer ceramic substrates are intended to provide additional wiring options beyond those that are provided by metallization layers within a semiconductor substrate, such as is intended by the first substrate 22a. The second contact region 23b is otherwise generally analogous or equivalent to the first contact regions 23a with respect to materials of composition and dimensions. The second solder layer 24b is otherwise generally analogous or equivalent to the first solder layers 24a with respect to materials of composition and dimensions.

FIG. 12 shows a schematic cross-sectional diagram of a chip carrier substrate in accordance with an embodiment of the invention. The chip carrier substrate is further fabricated and connected to a first substrate 22a (i.e., typically a semiconductor substrate) and a second substrate (i.e. typically a multi-layer ceramic substrate). The chip carrier substrate includes a first aperture within which is located a capacitor and a laterally separated second aperture within which is located a via. The first aperture has a first linewidth and a first aperture depth less than a second linewidth and a second aperture depth of the second aperture. The first aperture and the second aperture are formed simultaneously using a plasma etch method that is susceptible to a microloading effect. Due to the microloading effect, a first aperture having a first linewidth less than a second linewidth of a second aperture will etch to a first depth less than a second depth of the second aperture.

The preferred embodiments of the invention are illustrative of the invention rather than limiting of the invention. Revisions and modifications may be made to methods, materials, structures and dimensions of a chip carrier substrate in accordance with the preferred embodiments, while still providing a chip carrier substrate in accordance with the invention, further in accordance with the accompanying claims.

What is claimed is:

1. A method for manufacturing a semiconductor structure comprising:
    forming a chip carrier substrate by:
        forming a first trench having a first width and a first depth and a second trench having a second width and a second depth in a substrate, wherein said second width is greater than said first width and said second depth is greater than said first depth, and said first and second trenches extend from a front surface of said substrate into said substrate,
        depositing a stack of a first capacitor plate layer, a capacitor dielectric layer, and a second capacitor plate layer in that order within said first trench and said second trench, and
        planarizing a back surface of said substrate, wherein said first trench is spaced from a planarized back surface of said substrate and a portion of said second capacitor plate layer within said second trench is physically exposed at said planarized back surface of said substrate;
        forming at least one solder layer on a surface of said portion of said second capacitor plate layer; and
    affixing at least one semiconductor chip to said chip carrier substrate by connecting said at least one semiconductor chip at least to said portion of said second capacitor plate layer through said at least one solder layer.

2. The method of claim 1, wherein said first trench and said second trench are formed simultaneously.

3. The method of claim 2, wherein said first trench and said second trench are formed by a plasma etch.

4. The method of claim 2, wherein said first trench and said second trench are formed by:
    forming a mask layer on said front surface of said substrate;
    patterning said mask layer by removing a first portion of said mask layer having said first width and a second portion of said mask layer having said second width; and
    transferring a pattern in said mask layer into said substrate employing said patterned mask layer as an etch mask.

5. The method of claim 3, wherein said first trench and said second trench are formed by performing an etch process that has a microloading effect.

6. The method of claim 1, further comprising patterning said second capacitor plate layer, wherein said portion of said second capacitor plate layer is separated from another portion of said second capacitor plate layer that is located within said first trench.

7. The method of claim 6, further comprising patterning said first capacitor plate layer, wherein a portion of said first plate layer located within said second trench is separated from another portion of said first plate layer that is located within said first trench.

8. The method of claim 1, wherein said forming of said chip carrier substrate further comprises:
 removing a portion of said first capacitor plate layer within said second trench;
 subsequently removing a portion of said capacitor dielectric layer within said second trench; and
 subsequently removing a portion of said second capacitor layer within said second trench, while no material within said first trench is removed.

9. The method of claim 1, wherein a sidewall of said portion of said second capacitor plate layer extends to a plane that is coplanar with said planarized back surface of said substrate after said planarizing.

10. The method of claim 9, wherein a sidewall of a portion of said first capacitor plate layer located within said second trench extends to said plane after said planarizing.

11. The method of claim 10, wherein a sidewall of a portion of said capacitor dielectric layer extends to said plane after said planarizing.

12. The method of claim 1, further comprising forming a first dielectric liner layer on sidewalls and a bottom surface of said first trench and a second dielectric liner on sidewalls and a bottom surface of said second trench prior to said depositing of said stack.

13. The method of claim 12, further comprising removing a horizontal portion of said second dielectric liner during said planarizing, while said first dielectric liner remains embedded within said substrate without being physically exposed at said back surface of said substrate.

14. The method of claim 12, wherein said substrate comprises a semiconductor material, and said first and second dielectric liners are formed by oxidizing portions of said semiconductor material.

15. The method of claim 1, wherein said surface of said portion of said second capacitor plate layer is more proximal to said front surface of said substrate than to said planarized back surface of said substrate.

16. The method of claim 1, wherein said at least one solder layer comprises:
 a first solder structure located on said surface of said portion of said second capacitor plate layer and contacting one of said at least one semiconductor chip; and
 a second solder structure located on a surface of another portion of said second semiconductor plate layer that contiguously extends into said first trench and contacting said one of said at least one semiconductor chip.

17. The method of claim 1, wherein said surface of said portion of said second capacitor plate layer is coplanar with said planarized back surface of said substrate, and said at least one solder layer comprises a solder structure contacting one of said at least one semiconductor chip.

18. The method of claim 1, wherein said at least one solder layer comprises a first solder layer and a second solder layer, wherein said first solder layer comprises:
 a first solder structure located on said surface of said portion of said second capacitor plate layer and contacting one of said at least one semiconductor chip, and
 a second solder structure located on a surface of another portion of said second semiconductor plate layer that contiguously extends into said first trench and contacting said one of said at least one semiconductor chip; and
wherein said second solder layer comprises a third solder structure contacting another surface of said second capacitor plate layer that is coplanar with said planarized back surface of said substrate and contacting another of said at least one semiconductor chip.

* * * * *